United States Patent
Norimatsu (10) Patent No.: US 10,263,811 B2
(45) Date of Patent: Apr. 16, 2019

(54) EQUALIZING DEVICE, EQUALIZING METHOD, AND SIGNAL TRANSMITTING DEVICE

(71) Applicant: HITACHI METALS, LTD., Tokyo (JP)

(72) Inventor: Takayasu Norimatsu, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 15/862,000

(22) Filed: Jan. 4, 2018

(65) Prior Publication Data

US 2018/0198647 A1 Jul. 12, 2018

(30) Foreign Application Priority Data

Jan. 6, 2017 (JP) .................. 2017-000971

(51) Int. Cl.
*H04L 7/00* (2006.01)
*H04J 13/00* (2011.01)
*H04L 25/03* (2006.01)
*H04L 27/36* (2006.01)
*H04B 10/69* (2013.01)

(52) U.S. Cl.
CPC ... *H04L 25/03038* (2013.01); *H04B 10/6971* (2013.01); *H04J 13/0003* (2013.01); *H04L 7/00* (2013.01); *H04L 25/03146* (2013.01); *H04L 27/366* (2013.01)

(58) Field of Classification Search
USPC ................................................ 375/232, 233
See application file for complete search history.

(56) References Cited

U.S. PATENT DOCUMENTS

| 8,477,949 | B2* | 7/2013 | Larsen | ..................... | H04R 3/14 |
| | | | | | 381/1 |
| 2014/0062622 | A1* | 3/2014 | Hidaka | .................. | H04B 3/143 |
| | | | | | 333/28 R |
| 2014/0064351 | A1* | 3/2014 | Hidaka | .................. | H04L 27/01 |
| | | | | | 375/232 |
| 2016/0028562 | A1* | 1/2016 | Dallaire | ............... | H04L 25/061 |
| | | | | | 375/233 |
| 2016/0277219 | A1* | 9/2016 | Venkatram | ............. | H04L 7/033 |

FOREIGN PATENT DOCUMENTS

JP 2014-050104 A 3/2014

* cited by examiner

*Primary Examiner* — Eva Y Puente
(74) *Attorney, Agent, or Firm* — Volpe and Koenig, P.C.

(57) ABSTRACT

An equalizing device has: a low-frequency zero-point circuit having a zero point in a low-frequency band of a before-equalization frequency characteristic of a communication medium; a high-frequency zero-point circuit having a zero point in a high-frequency band of the before-equalization frequency characteristic of the communication medium; and an intermediate-frequency zero-point circuit having a zero point in an intermediate-frequency band present between the low-frequency band and the high-frequency band, wherein an inclination of a waveform of the before-equalization frequency characteristic of the communication medium changes in the intermediate-frequency band; wherein the equalizing device equalizes the signal transmitted through the communication medium so as to restrain an amount of change in an inclination of a waveform of the after-equalization frequency characteristic.

11 Claims, 14 Drawing Sheets

EQUALIZING DEVICE, EQUALIZING METHOD, AND SIGNAL TRANSMITTING DEVICE

BACKGROUND OF THE INVENTION

1. Field of the Invention

The present invention relates to equalizing devices, equalizing methods, and signal transmitting devices.

2. Description of the Related Art

Because of recent speed-up of communication, transmission losses of communication media such as metal cables are increasing. Normally, signals transmitted through a communication medium are input to a linear equalizer having waveform equalizing function. In a communication medium such as a metal cable, losses of a conductor due to a skin effect are dominant at low frequencies, and, on the other hand, dielectric losses are dominant at high frequencies. In other words, when signals are transmitted through a metal conductor, the signals undergo two types of losses, i.e., a conductor loss and a dielectric loss. The signals are affected by both of them at low frequencies. However, as the frequency is increased, the influence of the conductor loss reduces, and the influence of the dielectric loss increases. JP 2014-050104 A describes a system having a low-frequency equalizer, which compensates for the loss at low frequencies, and a high-frequency equalizer, which compensates for the loss at high frequencies.

Incidentally, a linear equalizer has to expand a band to the band that is equal to or higher than a Nyquist frequency (data rate: the frequency which is half of a symbol rate). In this case, if a high-frequency gain of a high-frequency equalizer is increased in order to equalize a high-frequency side, insufficient equalization tends to occur near the frequency (intermediate frequency) at which the inclination of frequency characteristics of a communication medium changes even if a low-frequency equalizer is added like JP 2014-050104 A. Therefore, the inclination of the after-equalization frequency characteristics does not become constant, and the bit error rate thereof is deteriorated.

When the frequency characteristics of an output with respect to an input of a signal are to be calculated, a transfer function for calculating the ratio of an input and an output which have undergone Laplace transform is used. The Laplace transform is a method to convert a signal in the time domain to that in the frequency domain. When a signal x(t) in the time domain is to be converted to the frequency domain, the conversion is carried out by Equation (1). Herein, s=jω ("j" is an imaginary number, and "ω" is an angular frequency) is satisfied. The transfer function is expressed by "s", a pole ($p_l$), and a zero point ($z_k$), and the absolute value of the transfer function is a gain of the output with respect to the input. Therefore, if the zero point is provided, the gain increases as the frequency increases.

$$X(s) = \int_{t=0}^{\infty} x(t) \cdot e^{-st} dt \qquad (1)$$

SUMMARY OF THE INVENTION

It is an object of the present invention to restrain deterioration of the bit error rate.

A first aspect of the present invention is an equalizing device to which a signal transmitted through a communication medium for transmitting the signal is input, the equalizing device having, at least: a low-frequency zero-point circuit having a zero point in a low-frequency band of a before-equalization frequency characteristic of the communication medium; a high-frequency zero-point circuit having a zero point in a high-frequency band of the before-equalization frequency characteristic of the communication medium; and an intermediate-frequency zero-point circuit having a zero point in an intermediate-frequency band present between the low-frequency band and the high-frequency band, wherein an inclination of a waveform of the before-equalization frequency characteristic of the communication medium changes in the intermediate-frequency band; wherein the equalizing device equalizes the signal transmitted through the communication medium so as to restrain an amount of change in an inclination of a waveform of the after-equalization frequency characteristic.

An aspect of the present invention is an equalizing device to which a signal transmitted through a communication medium for transmitting the signal is input, the equalizing device having, at least: a low-frequency equalizer that compensates for a loss in a low-frequency band of a before-equalization frequency characteristic of the communication medium; a high-frequency equalizer that compensates for a loss in a high-frequency band of the before-equalization frequency characteristic of the communication medium; and an intermediate-frequency equalizer that compensates for a loss in an intermediate-frequency band present between the low-frequency band and the high-frequency band, wherein an inclination of a waveform of the before-equalization frequency characteristic of the communication medium changes in the intermediate-frequency band; wherein the equalizing device equalizes the signal transmitted through the communication medium so as to restrain an amount of change in an inclination of a waveform of the after-equalization frequency characteristic.

A signal transmitting device according to an aspect of the Present invention has: a communication medium for transmitting a signal and the equalizing device according to the above described aspect.

An aspect of the present invention is an equalizing method for equalizing a signal transmitted through a communication medium, the equalizing method including: compensating for a loss in a low-frequency band of a before-equalization frequency characteristic of the communication medium; compensating for a loss in a high-frequency band of the before-equalization frequency characteristic of the communication medium; compensating for a loss in an intermediate-frequency band present between the low-frequency band and the high-frequency band, wherein an inclination of a waveform of the before-equalization frequency characteristic of the communication medium changes in the intermediate-frequency band; and restraining an amount of change in the inclination of the waveform of the after-equalization frequency characteristic.

According to the present invention, the deterioration of the bit error rate can be restrained.

DESCRIPTION OF THE PREFERRED EMBODIMENTS

Hereinafter, an embodiment of the present invention will be described by using drawings.

Figure 3:
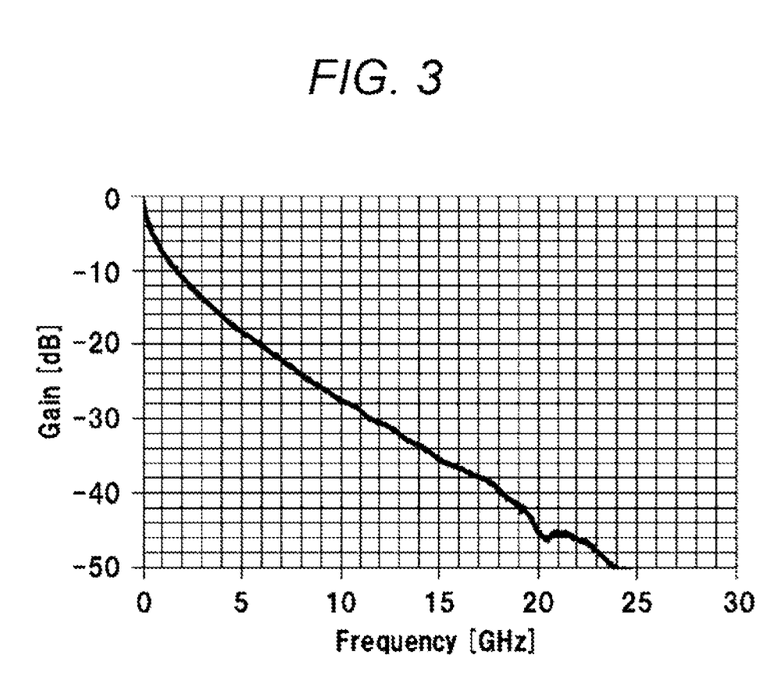
FIG. 3 is a graph showing frequency characteristics of losses of a communication medium of a metal conductor.

The embodiment of the present invention restrains the amount of change in the inclination of loss with respect to frequencies generated in communication via a long-distance communication medium. As the communication medium, for example, a metal conductor of copper, a copper alloy, or the like having a characteristic that losses of the conductor caused by the skin effect are dominant at low frequencies and that dielectric losses are dominant at high frequencies is used. In the communication medium using such a metal conductor, the inclination of loss with respect to frequencies changes in the vicinity of 1 GHz as shown in FIG. 3. Therefore, non-continuous points of the frequency characteristics can be prevented from being easily generated by not only compensating for low-frequency and high-frequency losses, but also compensating for losses near the frequency (intermediate-frequency band) at which the inclination changes. In the present specification, high frequencies are assumed to be equal to or higher than the Nyquist frequency of an input signal, low frequencies are assumed to be equal to or lower than the frequency at which switching between conductor loss and dielectric loss occurs, intermediate frequencies are assumed to be the frequencies therebetween at which switching between the Nyquist frequency and the conductor-loss/dielectric-loss occurs, and an inclination refers to a continuous linear change and, for example, excludes an inflection point at which a change occurs in a narrow range.

In other words, by using an equalizer having three or more frequency peaks and having a waveform equalizing function, not only low-frequency and high-frequency losses, but also losses in an intermediate-frequency band between low frequencies and high frequencies can be also compensated for. As a result, the amount of change in the inclination of the losses with respect to the frequencies after carrying out equalization by the linear equalizer can be restrained. In this manner, deterioration of the bit error rate is restrained by causing the inclination of the frequency characteristics after equalization by the linear equalizer to be constant as much as possible.

As described above, the inclination of the frequency characteristics (transmission characteristics) generated in the communication medium changes at a certain frequency. Therefore, if the signal transmitted through the communication medium is equalized by a linear equalizer, insufficient equalization or excessive equalization occurs, which leads to deterioration of the bit error rate. Therefore, a linear equalizer having a zero point near the frequency (intermediate-frequency band) at which the inclination of the transmission characteristics of the communication medium changes is added to weaken the influence of the change of the inclination, thereby carrying out compensation so that the inclination of the transmission characteristics after equalization by the whole linear equalizer becomes more constant.

Figure 1:
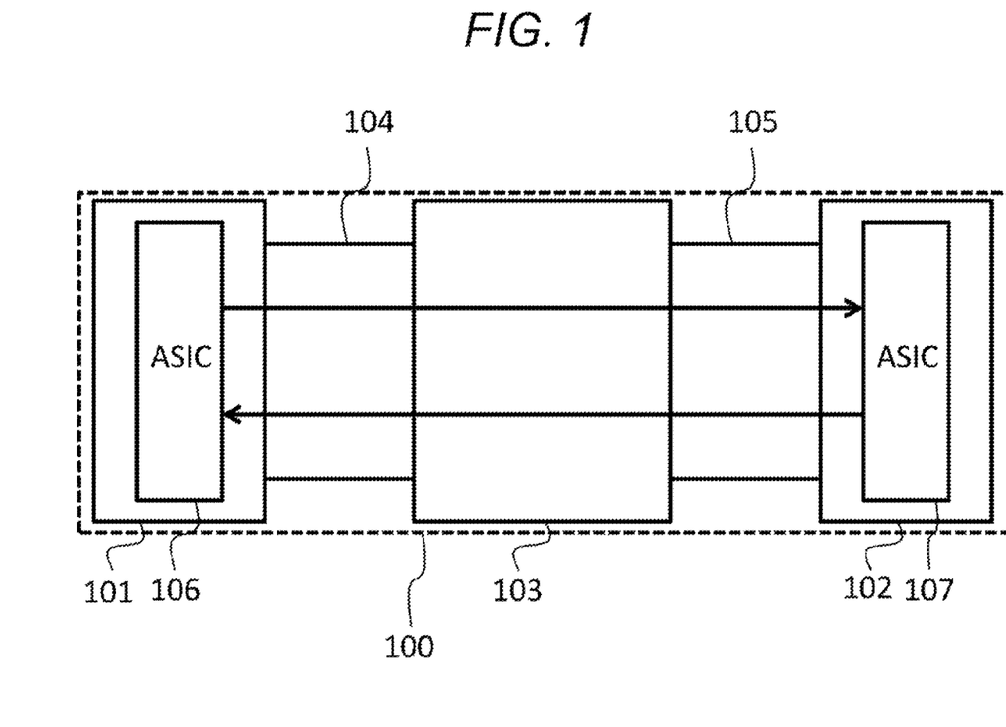
FIG. 1 is a diagram showing a signal transmitting device, which carries out communication via a communication medium.

FIG. 1 is an example of an (electric) signal transmitting device. With reference to FIG. 1, an equalizing device 106 having a waveform equalizing function is mounted on a substrate 101. An equalizing device 107 having a waveform equalizing function is mounted on a substrate 102. The equalizing device 106 and the equalizing device 107 carry out communication via a communication medium 103 and connectors 104 and 105 thereof. The communication medium 103 is, for example, a metal coaxial cable or a communication medium using metal conductors such as lines on a substrate.

Figure 2:
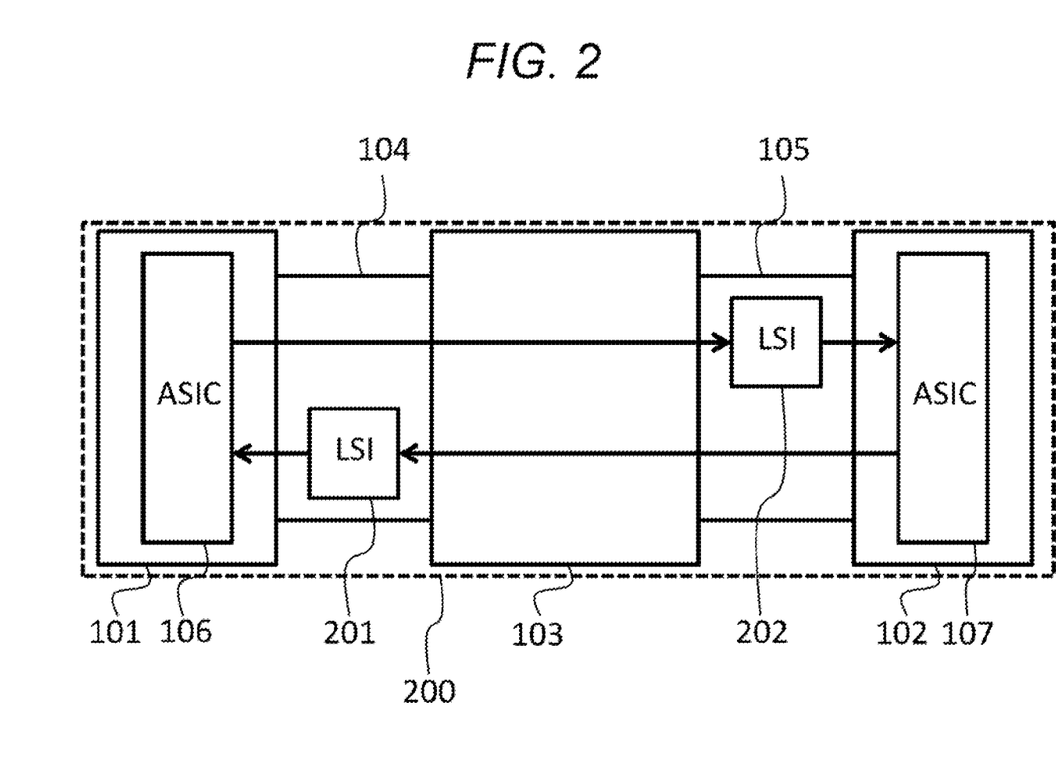
FIG. 2 is a diagram showing a signal transmitting device, in which equalizers are mounted in connectors when communication is carried out via a communication medium.

FIG. 2 is an example of an (electric) signal transmitting device in which equalizers are mounted on connectors. With reference to FIG. 2, an equalizing device 201 and an equalizing device 202 having equalizers are mounted in the connectors 104 and 105, respectively. In this manner, part or all of the functions of equalizers may be incorporated in different semiconductors to be mounted on the connectors 104 and 105. For example, only linear equalizers may be mounted on the equalizing device 201 and the equalizing device 202.

FIG. 3 is an example of transmission characteristics (frequency characteristics) of the communication medium 103 used in FIG. 1 or FIG. 2. As shown in FIG. 3, there is a change in inclination in the vicinity of 1 GHz, and the influence thereof causes insufficient equalization or excessive equalization in a linear equalizer. Therefore, jitter deterioration occurs, and a bit error rate increases. Herein, "jitter" indicates the black parts present between adjacent eye openings (white parts) shown in FIG. 14. Also, the "eye openings" means margins in retrieval of data.

Figure 4:
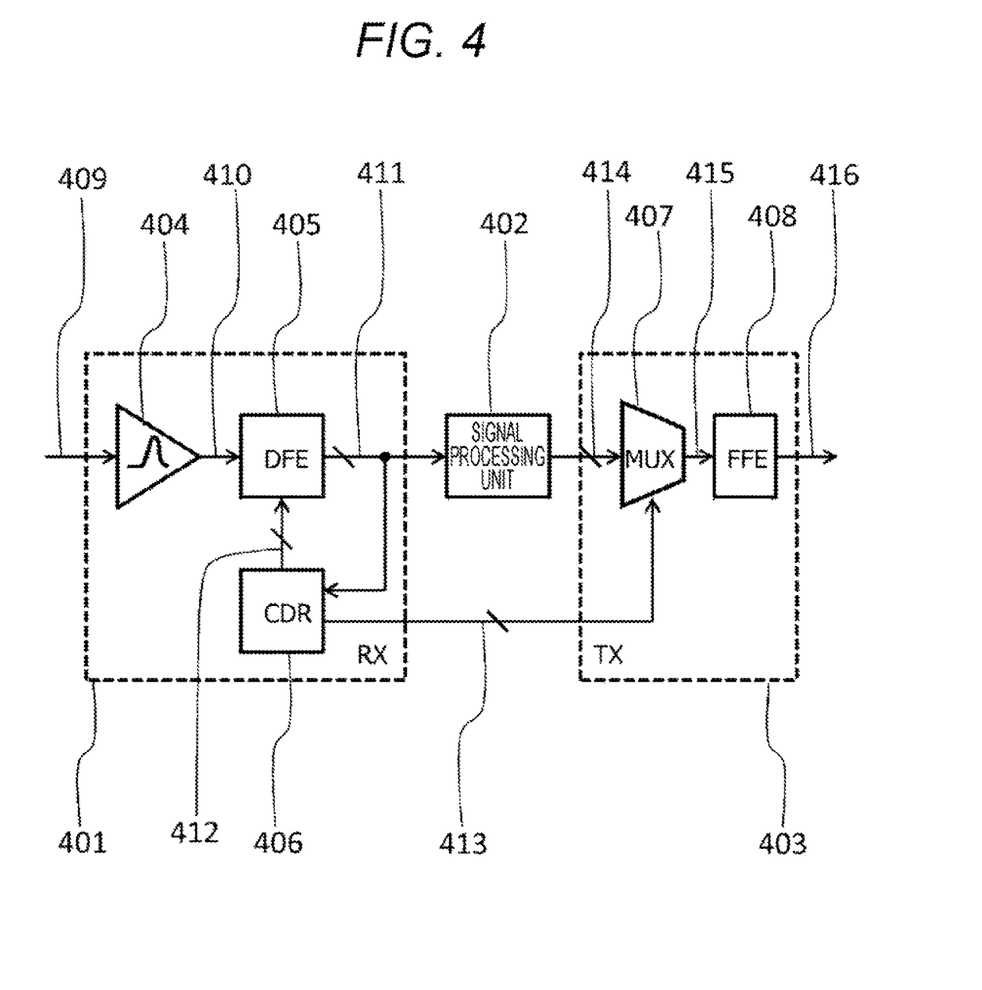
FIG. 4 is a diagram showing an equalizing device used in the signal transmitting device.

With reference to FIG. 4, the equalizing device 106 or the equalizing device 107 shown in FIG. 1 and FIG. 2 includes a receiver 401, a signal processing unit 402, and a transmitter 403. In such a configuration, an input signal 409 is equalized by the receiver 401, receiver output data 411 is subjected to data processing in the signal processing unit 402, and, then, signal-processing-unit output data 414 is input to the transmitter 403. The transmitter 403 outputs an equalized output signal 416. The receiver 401 includes a linear equalizer 404, a DFE (Decision feedback Equalizer) 405, and a CDR (Clock and Data Recovery) 406.

The linear equalizer 404 equalizes the receiver input 409, the DFE 405 equalizes a linear-equalizer output 410 at the timing of a receiver clock pulse 412, which is from the CDR 406, and outputs the receiver output data 411. The DFE 405 includes an ADC (Analog to Digital Converter) in some cases. The CDR 406 receives the receiver output data 411 and generates the receiver clock pulse 412 and a transmitter clock pulse 413, which have undergone timing adjustment of clock pulses. The transmitter 403 includes a multiplexer 407 and a FFE (Feed Forward Equalizer) 408. The signal-processing-unit output data 414 from the signal processing unit 402 is serialized by the multiplexer 407 in accordance with the timing of the transmitter clock pulse 413. Then, the multiplexer 407 outputs transmission-signal serial data 415. The FFE 408 equalizes the transmission-signal serial data 415 and outputs the transmitter output 416.

Figure 5:
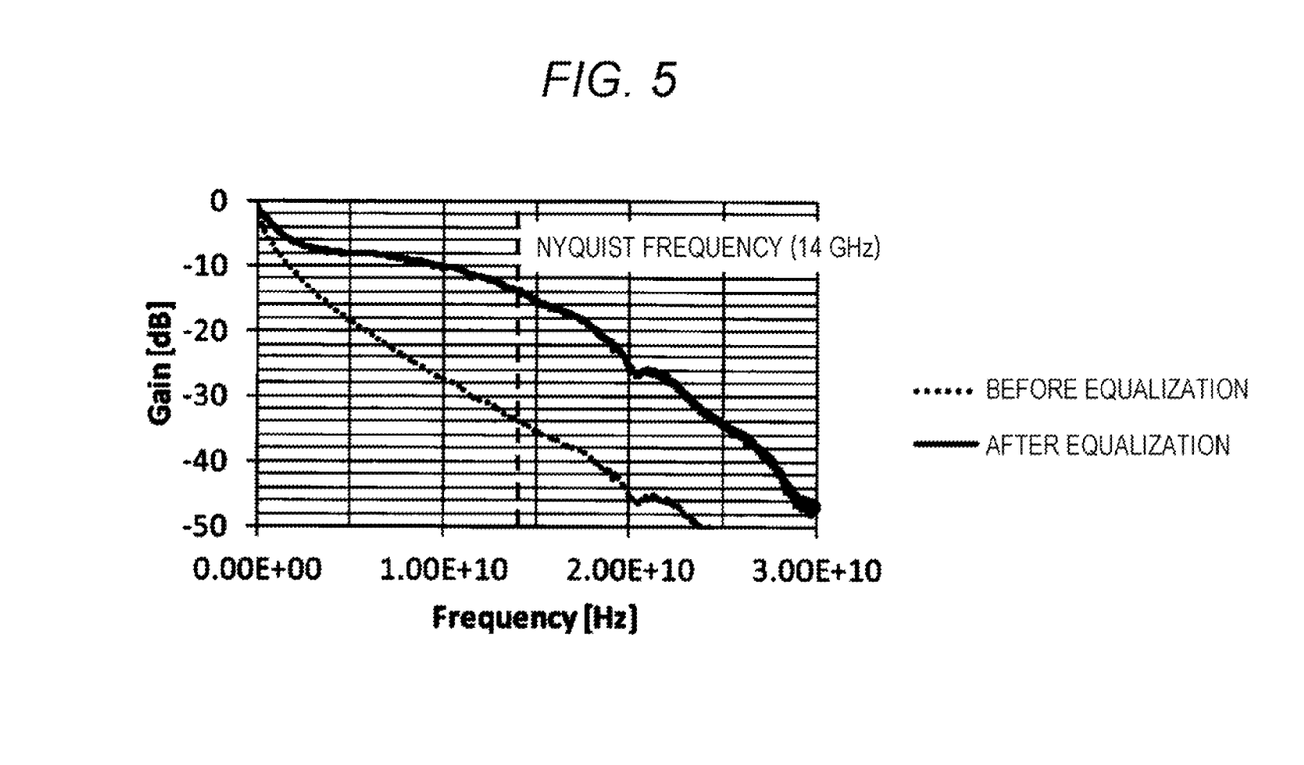
FIG. 5 is a graph showing transmission characteristics of a case in which only low-frequency and high-frequency losses of a communication medium of a metal conductor are compensated for by equalizers.

FIG. 5 shows transmission characteristics of a communication medium before equalization and transmission characteristics after equalization in which low-frequency and high-frequency losses of the communication medium have been compensated for by a linear equalizer. FIG. 5 shows an example at a symbol rate of 28 G/s, and a Nyquist frequency in this case becomes 14 GHz. The equalizer compensates for the signals up to 14 GHz in the Nyquist frequency. As shown in FIG. 5 insufficient equalization occurs near the frequencies at which the inclination of the transmission characteristics of the communication medium changes. This characteristic is a cause of jitter increase, and increasing the tap number of DFE is a countermeasure therefor. However, since DFE is a discrete equalizer, there are disadvantages that there are noise components which remain because of discrete processing and that multiple taps increase areas and electric power consumption. Therefore, it is better to compensate for the losses of the communication medium by the linear equalizer as much as possible, and jitter decreases as the inclination of the transmission characteristics after the equalization of the linear equalizer becomes more constant.

Figure 6:
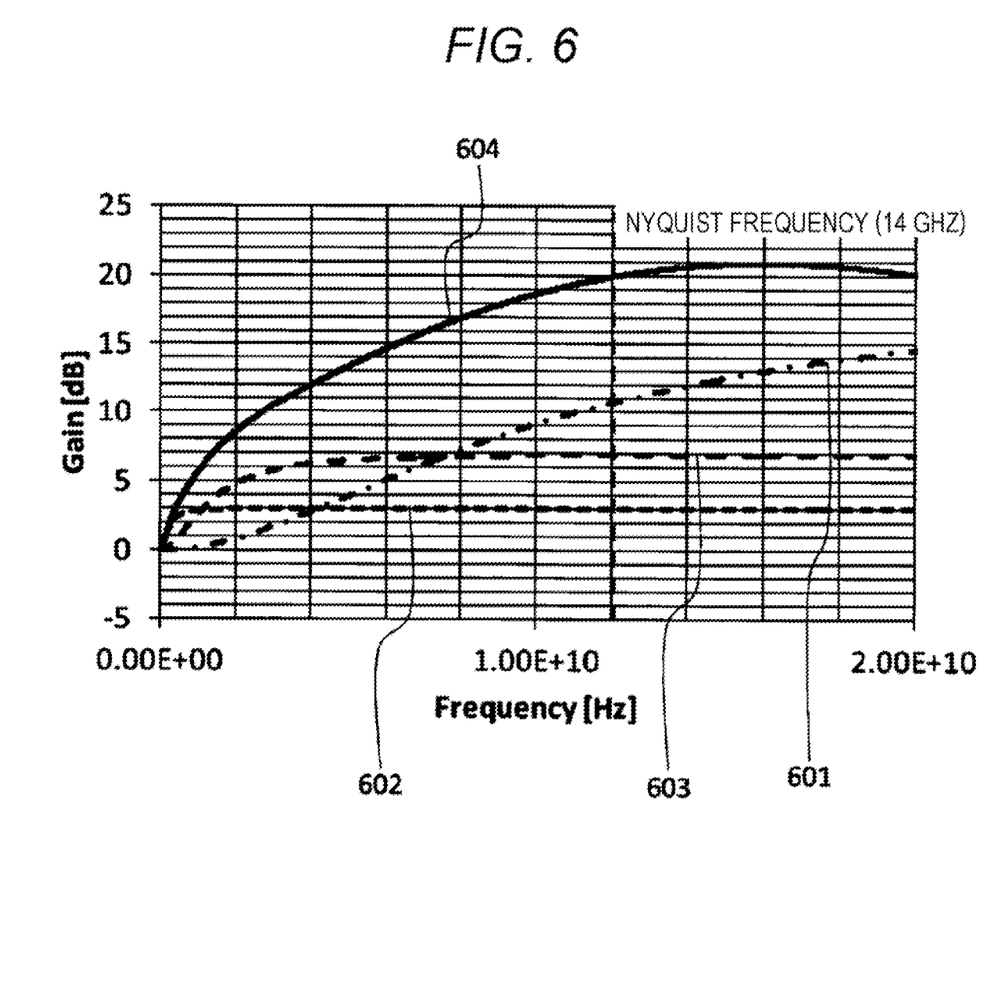
FIG. 6 is a graph showing transmission characteristics of linear equalizers according to an embodiment of the present invention.

FIG. 6 shows transmission characteristics 601 of a high-frequency equalizer, transmission characteristics 602 of a low-frequency equalizer, and, in addition, transmission characteristics 603 of an intermediate-frequency equalizer which disposes a zero point at a frequency (intermediate frequency) at which the inclination of the transmission characteristics of the communication medium changes. FIG. 6 also shows synthesized transmission characteristics 604 obtained by synthesizing the transmission characteristics 601 of the high-frequency equalizer, the transmission characteristics 602 of the low-frequency equalizer, and the transmission characteristics 603 of the intermediate-frequency equalizer. The transmission characteristics of the equalizers in FIG. 6 are examples for transmitting signals of 56 Gb/s PAM4, and a Nyquist frequency in this case is 14 GHz. The equalizer compensates for the signals up to 14 GHz in the Nyquist frequency.

Figure 7:
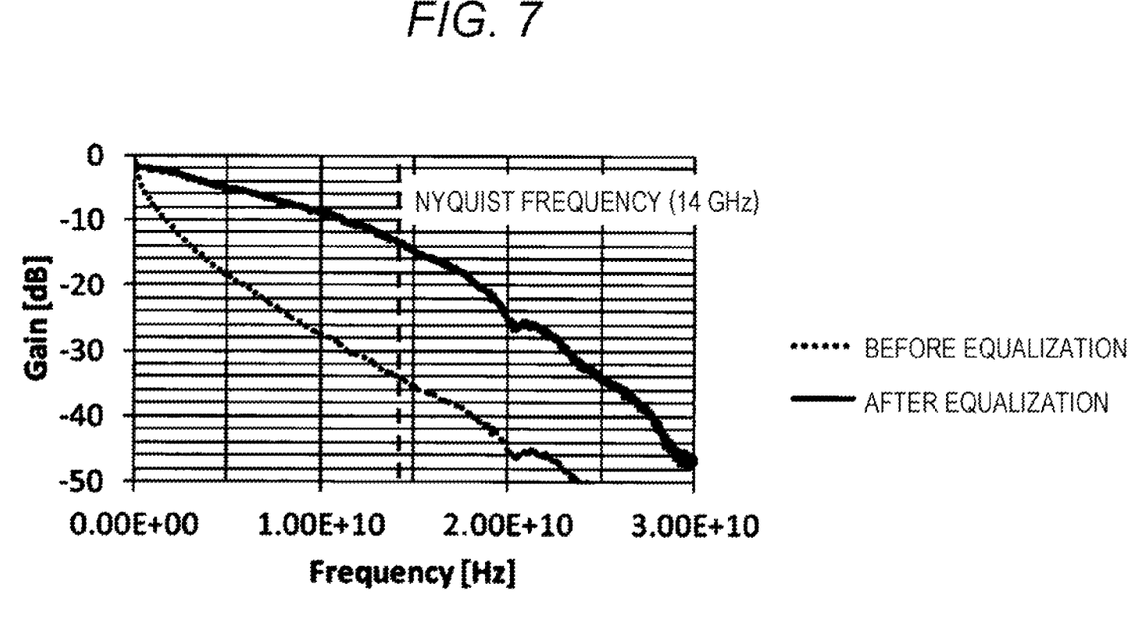
FIG. 7 is a graph showing transmission characteristics of a case in which losses of the communication medium of the metal conductor are compensated for by the linear equalizers according to the embodiment of the present invention.

FIG. 7 shows results of equalizing the communication medium 103 by using the synthesized transmission characteristics 604 shown in FIG. 6. As well as FIG. 6, this is an example for transmitting signals of 56 Gb/s PAM4, and a Nyquist frequency in this case is 14 GHz. Different from FIG. 5, it can be understood that the inclination of the after-equalization transmission characteristics of the communication medium 103 becomes almost constant. In this manner, by adding the equalizer which disposes a zero point at the intermediate frequency at which the inclination of the transmission characteristics of the communication medium 103 changes, the inclination of the after-equalization transmission characteristics can be caused to be constant without increasing the tap number of DIVE, and jitter is improved.

Figure 14:
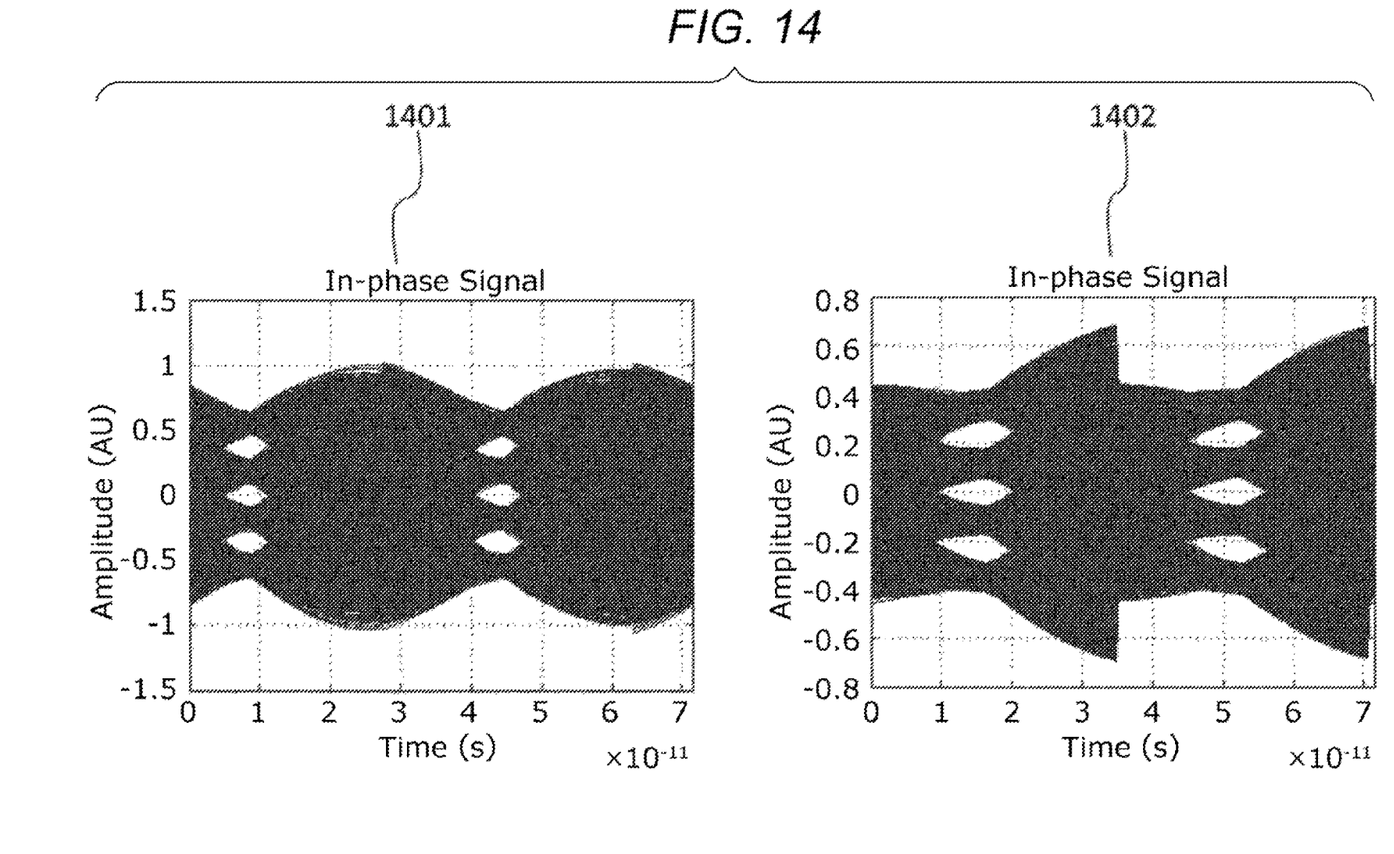
FIG. 14 is a diagram showing a signal transmission result 1401 of a conventional equalizer and a signal transmission result 1402 of an equalizer according to the embodiment of the present invention.

FIG. 14 shows a signal transmission result 1401 of a conventional equalizer and a signal transmission result 1402 of the equalizer which causes the inclination of the equalized transmission characteristics to be constant. As shown in FIG. 14, it can be understood that EYE openings are widened by causing the inclination of the equalized transmission characteristics to be constant.

EXAMPLE 1

Figure 8:
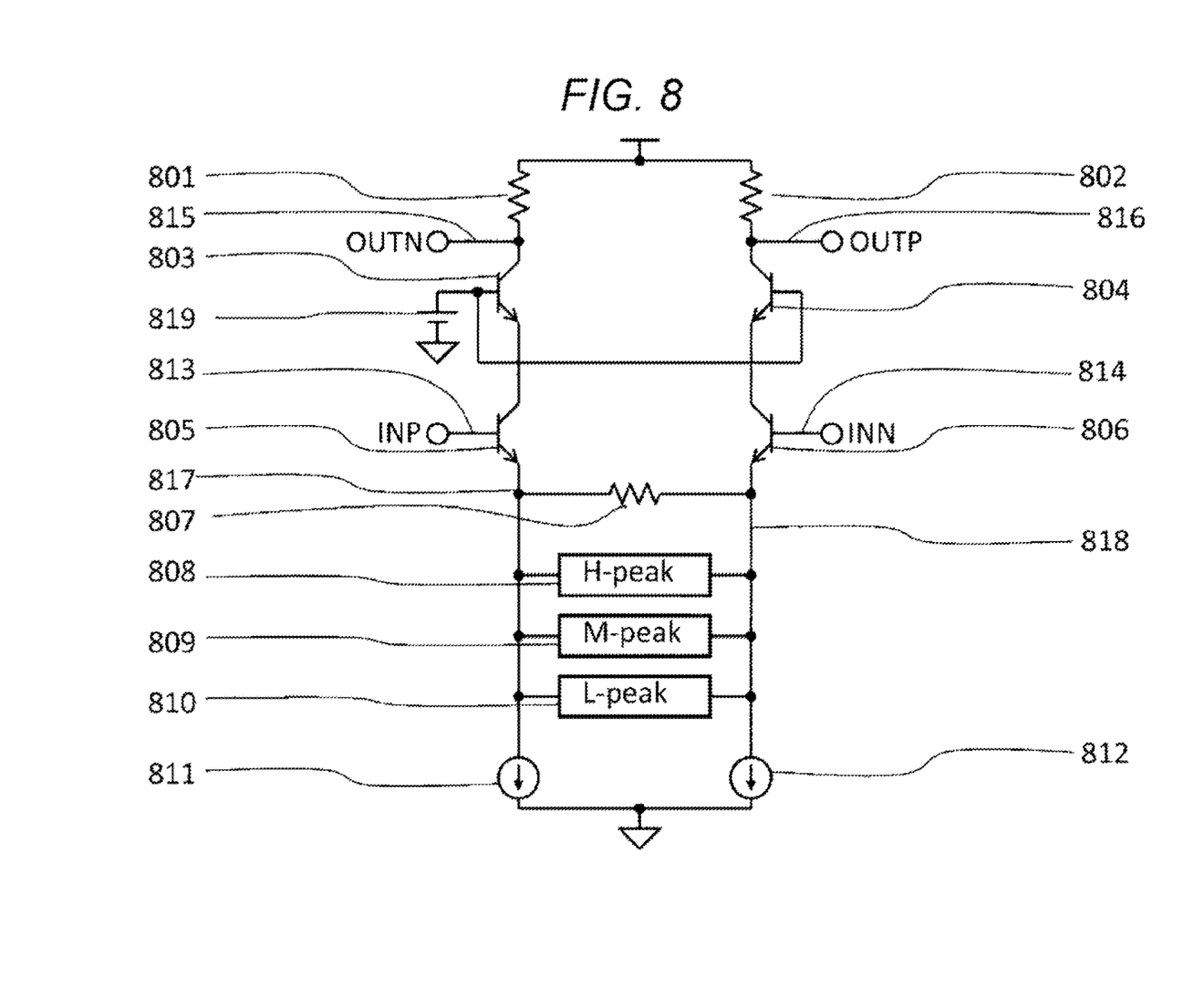
FIG. 8 is a diagram showing an equalizer according to Example 1.

With reference to FIG. 8, a linear equalizer for realizing the above described embodiment will be described. FIG. 8 shows a linear equalizer of a fully-differential amplifier using a bipolar transistor, and this is similar also in a circuit using a MOS (Metal Oxide Semiconductor) transistor.

The full amplifying circuit of FIG. 8 includes: load resistors 801 and 802, cascode transistors 803 and 804, amplifying transistors 805 and 806, a degeneration resistor 807, a high-frequency zero-point circuit 808, an intermediate-frequency zero-point circuit 809, a low-frequency zero-point circuit 810, and current sources 811 and 812. Herein, the load resistors 801 and 802 may be loads including inductors. The high-frequency zero-point circuit 808, the intermediate-frequency zero-point circuit 809, and the low-frequency zero-point circuit 810 are disposed between an emitter 817 of the transistor 805 and an emitter 818 of the transistor 806.

As described in FIG. 7, the intermediate-frequency zero-point circuit 809 disposes a zero point at a frequency (intermediate frequency) at which the inclination of the transmission characteristics of the communication medium changes. The low-frequency zero-point circuit 810 sets a zero point so that a peak is at a frequency lower than the intermediate frequency. On the other hand, the high-frequency zero-point circuit 808 sets a zero point so that a peak is at a frequency higher than the intermediate frequency.

In the linear equalizer, differential inputs 813 and 814 are input to the transistors 805 and 806, and outputs 815 and 816 having three peaks according to the three zero points and obtained by amplifying and waveform-equalizing the inputs are output. FIG. 8 shows an example with the three zero points, but three or more zero points may be provided. In that case, a zero point(s) may be disposed between the zero point generated by the intermediate-frequency zero-point circuit 809 and the zero point generated by the high-frequency zero-point circuit 808.

The circuit of FIG. 8 is an example which realizes all zero points by one circuit and has an advantage that electric power consumption can be reduced. Moreover, the area thereof can be also reduced, which contributes to cost reduction.

Figure 9:
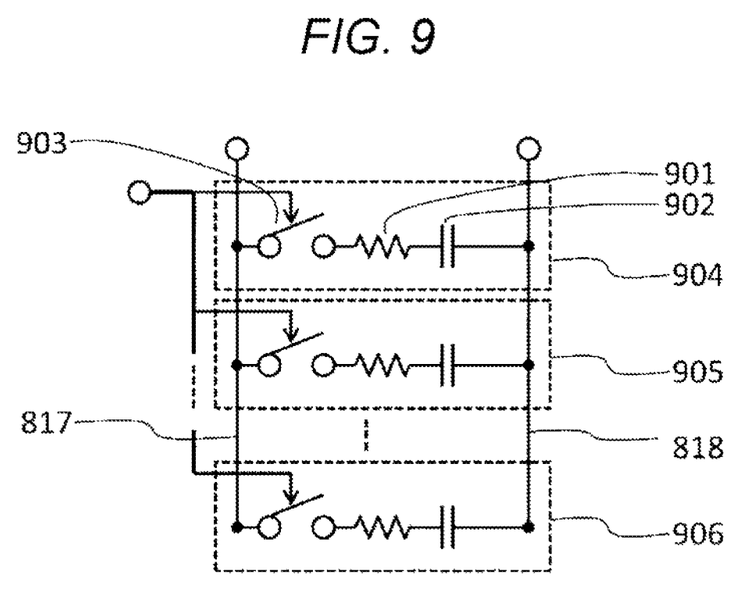
FIG. 9 is a diagram showing zero-point generating circuits used in the equalizer according to Example 1.

FIG. 9 shows an example of the zero-point circuits 808, 809, and 810. The zero-point circuits 808, 809, and 810 are circuits in which a plurality of cells 904 are juxtaposed between the emitter 817 and the emitter 818, wherein each cell serially connects a resistor 901, a capacitance 902, and a switch 903. Each of all the cells 905, 906, etc. includes the resistor 901, the capacitance 902, and the switch 903 having the same sizes. The sizes of the resistor 901 and the capacitance 902 are determined by the frequency and gain of the required zero point.

EXAMPLE 2

Figure 10:
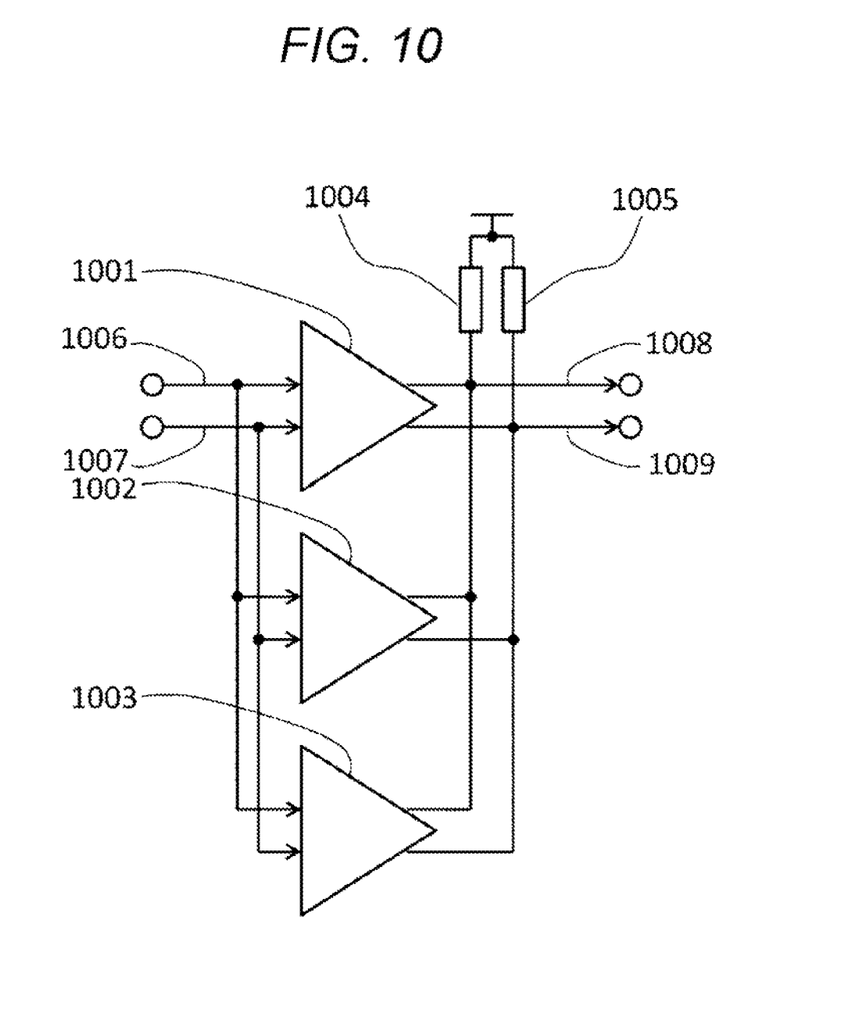
FIG. 10 is a diagram showing a configuration of an equalizing device according to Example 2.

With reference to FIG. 10, an equalizing device of Example 2 for realizing the above described embodiment will be described.

As shown in FIG. 10, in this equalizing device, a high-frequency equalizer 1001, an intermediate-frequency equalizer 1002, and a low-frequency equalizer 1003 are disposed in parallel, a same differential-input positive side 1006 and a same differential-input negative side 1007 are connected to each of them, and output loads 1004 and 1005 are connected to common outputs 1008 and 1009, respectively. Currents are output from the high-frequency equalizer 1001, the intermediate-frequency equalizer 1002, and the low-frequency equalizer 1003 and are summed up by the output loads 1004 and 1005. Example 2 is inferior to Example 1 in terms of electric power consumption and area, but is advantageous in a case in which the amount of equalization is switched since the zero points of the high-frequency equalizer 1001, the intermediate-frequency equalizer 1002, and the low-frequency equalizer 1003 do not affect one another.

Figure 11:
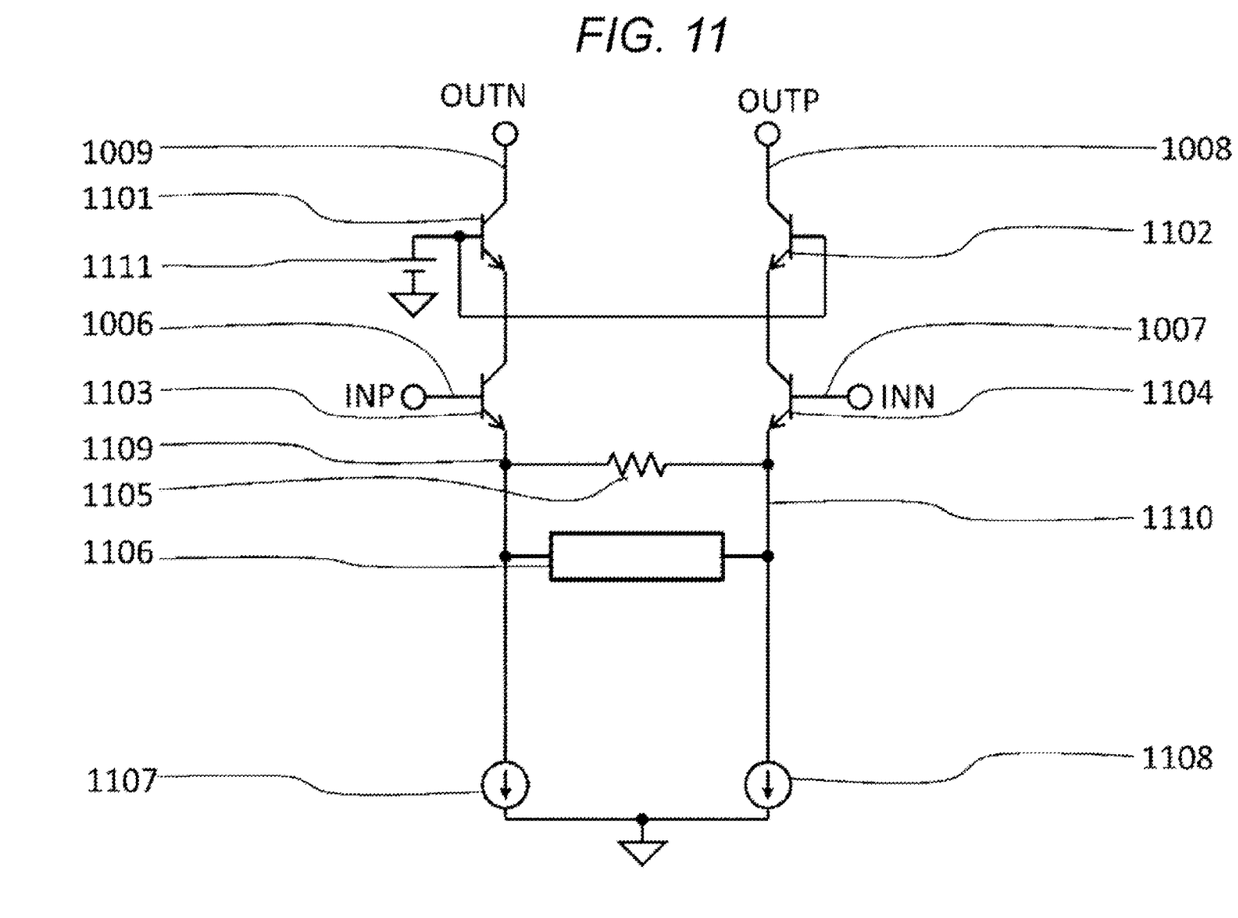
FIG. 11 is a diagram showing a zero-point generating circuit used in an equalizer of the equalizing device according to Example 2.

FIG. 11 shows a configuration of the high-frequency equalizer 1001, the intermediate-frequency equalizer 1002, or the low-frequency equalizer 1003. The configuration is almost the same as that of FIG. 8, and the equalizer includes: cascode transistors 1101 and 1102, amplifying transistors 1103 and 1104, a degeneration resistor 1105, a zero-point circuit 1106, and current sources 1107 and 1108. Voltages are supplied to the cascode transistors 1101 and 1102 from a bias voltage source 1111, and the input differential signals 1006 and 1007 are converted to currents by the transistors 1103 and 1104, pass through the cascode transistors 1101 and 1102, and are output to the outputs 1009 and 1008. The zero-point circuit 1106 is connected to an emitter 1109 of the transistor 1103 and an emitter 1110 of the transistor 1104.

The zero-point circuit 1106 is similar to the circuit shown in FIG. 9, and the combination of the values of the resistor 901 and the capacitance 902 shown in FIG. 9 is changed depending on for which one of the high-frequency equalizer 1001, the intermediate-frequency equalizer 1002, and the low-frequency equalizer 1003 this circuit is to be used.

Figure 12:
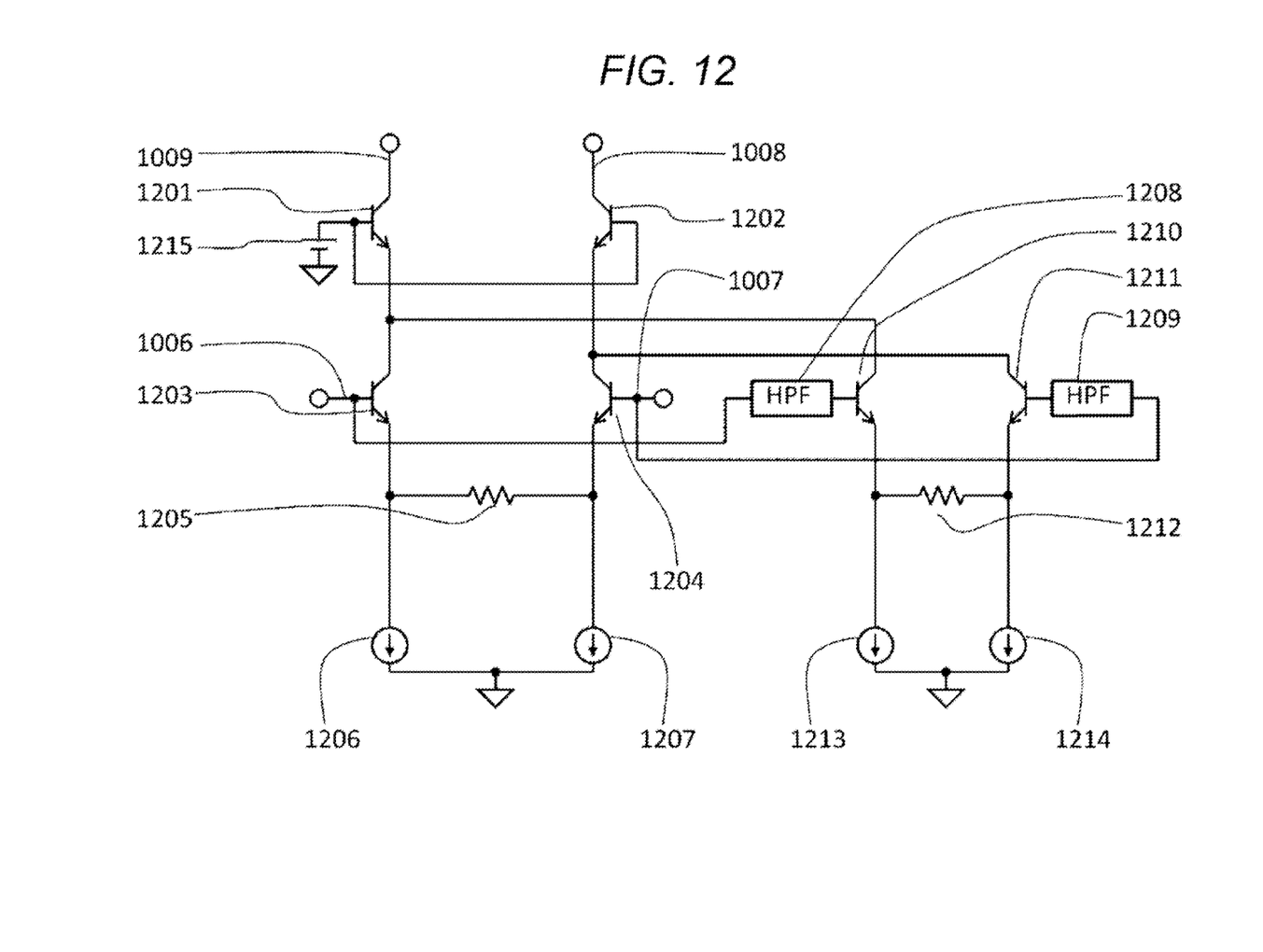
FIG. 12 is a diagram showing another zero-point generating circuit used in the equalizer of the equalizing device according to Example 2.

FIG. 12 shows another configuration of the high-frequency equalizer 1001, the intermediate-frequency equalizer 1002, or the low-frequency equalizer 1003. As shown in FIG. 12, the high-frequency equalizer 1001, the intermediate-frequency equalizer 1002, or the low-frequency equalizer 1003 includes: cascade transistors 1201 and 1202, amplifying transistors 1203 and 1204, a degeneration resistor 1205, current sources 1206 and 1207, high-pass filters 1208 and 1209, amplifying transistors 1210 and 1211, a degeneration resistor 1212, and current sources 1213 and 1214.

The signal of the differential-input positive side 1006 and the signal of the differential-input negative side 1007 are input to the transistors 1203 and 1204 and to the high-pass filters 1208 and 1209. The transistors 1203 and 1204 convert the input signals to currents without change. However, the high-pass filters 1208 and 1209 transmit only high-frequency signals to the transistors 1210 and 1211, and the transistors 1210 and 1211 convert only the high-frequency components of the input signals to currents. The output currents of the transistors 1203 and 1204 and the transistors 1210 and 1211 are summed up, respectively, pass through the cascade transistors 1201 and 1202 to which a bias voltage is applied from a bias voltage source 1215, and are output to the outputs 1009 and 1008, respectively. Therefore, by changing the bands of the high-pass filters 1208 and 1209, an equalizer having peaks at arbitrary frequencies can be realized.

EXAMPLE 3

Figure 13:
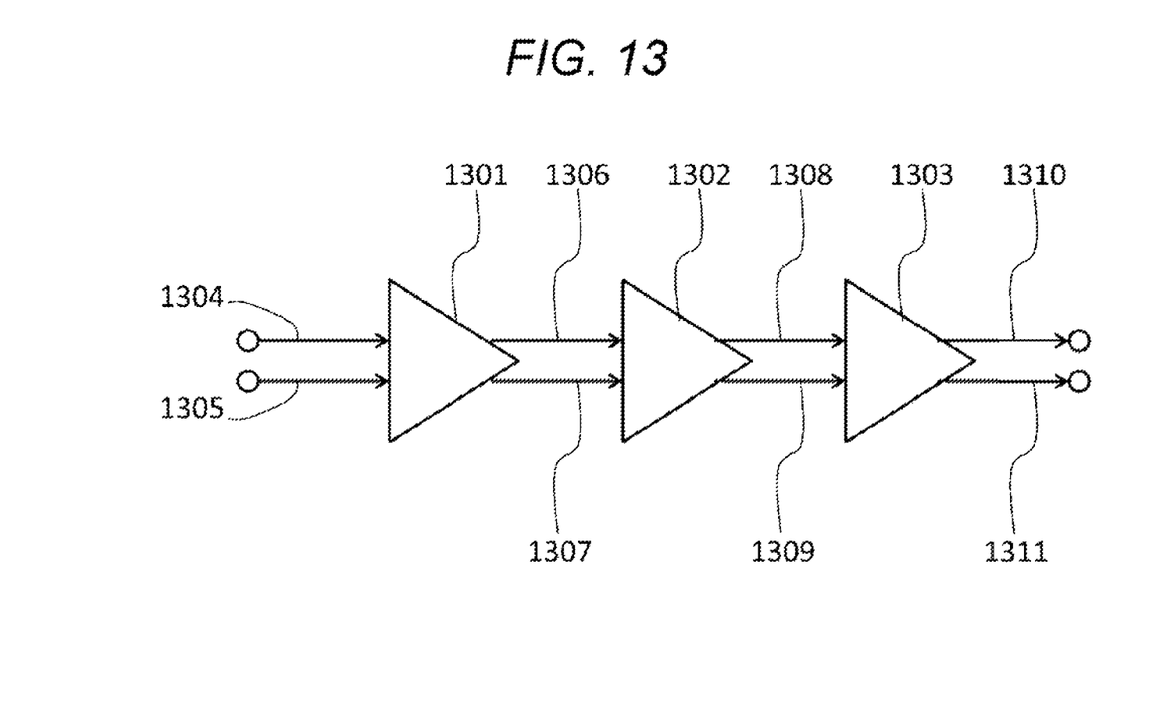
FIG. 13 is a diagram showing a configuration of an equalizing device according to Example 3.

With reference to FIG. 13, an equalizing device of Example 3 for realizing the above described embodiment will be described.

As shown in FIG. 13, the equalizing device includes three types of equalizers, which are connected in series. The equalizing device includes a high-frequency equalizer 1301, an intermediate-frequency equalizer 1302, and a low-frequency equalizer 1303. As the connecting order of the high-frequency equalizer 1301, the intermediate-frequency equalizer 1302, and the low-frequency equalizer 1303, an optimum connecting order is selected depending on design, and FIG. 13 only illustrates an example thereof. Input signals 1304 and 1305 to the equalizer is subjected to amplification of the high-frequency side thereof by the high-frequency equalizer 1301. Outputs 1306 and 1307 of the high-frequency equalizer 1301 are input to the intermediate-frequency equalizer 1302 and are subjected to amplification of the frequencies which are higher than the frequency at which the inclination of the transmission characteristics of the communication medium changes. Outputs 1308 and 1309 of the intermediate-frequency equalizer 1302 are input to the low-frequency equalizer 1303, are subjected to amplification the frequencies which are lower than the frequency at which the inclination of the transmission characteristics of the communication medium changes, and are output as outputs 1310 and 1311.

Example 3 is inferior to Examples 1 and 2 in terms of electric power consumption and area, but enables independent designing of all of the equalizers, and has a high degree of freedom of designing. Therefore, development cost can be reduced. Each of the high-frequency equalizer 1301, the intermediate-frequency equalizer 1302, and the low-frequency equalizer 1303 in FIG. 13 can be realized by a circuit in which a load is added to the configuration of the equalizer of FIG. 11 or FIG. 12.

What is claimed is:

1. An equalizing device to which a signal transmitted through a communication medium for transmitting the signal is input, the equalizing device comprising, at least:
    a low-frequency zero-point circuit having a zero point in a low-frequency band of a before-equalization frequency characteristic of the communication medium;
    a high-frequency zero-point circuit having a zero point in a high-frequency band of the before-equalization frequency characteristic of the communication medium; and
    an intermediate-frequency zero-point circuit having a zero point in an intermediate-frequency band present between the low-frequency band and the high-frequency band, wherein an inclination of a waveform of the before-equalization frequency characteristic of the communication medium changes in the intermediate-frequency band, wherein
    the equalizing device equalizes the signal transmitted through the communication medium so as to restrain an amount of change in the inclination of the waveform of an after-equalization frequency characteristic.

2. An equalizing device to which a signal transmitted through a communication medium for transmitting the signal is input, the equalizing device comprising, at least:
    a low-frequency equalizer that compensates for a loss in a low-frequency band of a before-equalization frequency characteristic of the communication medium;
    a high-frequency equalizer that compensates for a loss in a high-frequency band of the before-equalization frequency characteristic of the communication medium; and
    an intermediate-frequency equalizer that compensates for a loss in an intermediate-frequency band present between the low-frequency band and the high-frequency band, wherein an inclination of a waveform of the before-equalization frequency characteristic of the communication medium changes in the intermediate-frequency band, wherein the equalizing device equalizes the signal transmitted through the communication medium so as to restrain an amount of change in the inclination of the waveform of an after-equalization frequency characteristic.

3. The equalizing device according to claim 2, wherein the low-frequency equalizer, the high-frequency equalizer, and the intermediate-frequency equalizer are connected in parallel.

4. The equalizing device according to claim 2, wherein the low-frequency equalizer, the high-frequency equalizer, and the intermediate-frequency equalizer are connected in series.

5. A signal transmitting device comprising:
a communication medium for transmitting a signal; and
the equalizing device according to claim 1.

6. The signal transmitting device according to claim 5, wherein
the communication medium is a metal conductor having a characteristic that a loss caused by a skin effect is dominant in the low-frequency band and that a dielectric loss is dominant in the high-frequency band.

7. The signal transmitting device according to claim 5, wherein
the equalizing device is mounted in a connector of the communication medium.

8. A signal transmitting device comprising:
a communication medium for transmitting a signal; and
the equalizing device according to claim 2.

9. The signal transmitting device according to claim 8, wherein
the communication medium is a metal conductor having a characteristic that a loss caused by a skin effect is dominant in the low-frequency band and that a dielectric loss is dominant in the high-frequency band.

10. The signal transmitting device according to claim 8, wherein
the equalizing device is mounted in a connector of the communication medium.

11. An equalizing method for equalizing a signal transmitted through a communication medium, the equalizing method comprising:
compensating for a loss in a low-frequency band of a before-equalization frequency characteristic of the communication medium;
compensating for a loss in a high-frequency band of the before-equalization frequency characteristic of the communication medium;
compensating for a loss in an intermediate-frequency band present between the low-frequency band and the high-frequency band, wherein an inclination of a waveform of the before-equalization frequency characteristic of the communication medium changes in the intermediate-frequency band; and
restraining an amount of change in the inclination of the waveform of an after-equalization frequency characteristic.

* * * * *